(12) United States Patent
Farkas et al.

(10) Patent No.: US 7,674,725 B2
(45) Date of Patent: Mar. 9, 2010

(54) TREATMENT SOLUTION AND METHOD OF APPLYING A PASSIVATING LAYER

(75) Inventors: Janos Farkas, Isere (FR); Sebastien Petitdidier, Isere (FR)

(73) Assignee: Freescale Semiconductor, Inc., Austin, TX (US)

( * ) Notice: Subject to any disclaimer, the term of this patent is extended or adjusted under 35 U.S.C. 154(b) by 27 days.

(21) Appl. No.: 11/914,878

(22) PCT Filed: May 25, 2005

(86) PCT No.: PCT/EP2005/006501

§ 371 (c)(1),
(2), (4) Date: Nov. 19, 2007

(87) PCT Pub. No.: WO2006/125461

PCT Pub. Date: Nov. 30, 2006

(65) Prior Publication Data

US 2008/0194116 A1 Aug. 14, 2008

(51) Int. Cl.
*H01L 21/31* (2006.01)
(52) U.S. Cl. ............... 438/778; 438/780; 438/782; 438/906
(58) Field of Classification Search ........... 438/758, 438/778, 779, 780, 781, 782, 790, 794, 906
See application file for complete search history.

(56) References Cited

U.S. PATENT DOCUMENTS

| | | | |
|---|---|---|---|
| 6,096,650 A | 8/2000 | Robinson et al. | |
| 6,207,569 B1 | 3/2001 | Schonauer et al. | |
| 6,277,203 B1 | 8/2001 | Jiang et al. | |
| 6,355,111 B1 | 3/2002 | Gaylord, III et al. | |
| 6,444,569 B2 | 9/2002 | Farkas et al. | |
| 6,569,349 B1 * | 5/2003 | Wang et al. ............ | 252/79.1 |
| 7,188,630 B2 * | 3/2007 | Flake et al. ............ | 134/1.3 |
| 7,579,279 B2 | 8/2009 | Flake et al. | |
| 2002/0121290 A1 | 9/2002 | Tang et al. | |
| 2003/0073601 A1 * | 4/2003 | Small et al. ............ | 510/391 |
| 2003/0207778 A1 | 11/2003 | So et al. | |
| 2004/0074518 A1 | 4/2004 | Korthuis et al. | |
| 2004/0167047 A1 | 8/2004 | Ishikawa et al. | |
| 2005/0009359 A1 | 1/2005 | Sharma | |

FOREIGN PATENT DOCUMENTS

| | | |
|---|---|---|
| CN | 1335382 | 2/2002 |
| EP | 0986096 A2 | 3/2000 |
| EP | 1310989 B1 | 12/2005 |
| WO | 03091376 A1 | 11/2003 |
| WO | 2004102620 A2 | 11/2004 |

OTHER PUBLICATIONS

International Search Report and Written Opinion, PCT/EP2005/006501, dated Mar. 7, 2006.

* cited by examiner

*Primary Examiner*—Kevin M Picardat

(57) ABSTRACT

A treatment solution for a semiconductor wafer comprising water, a passivating reagent and a surfactant. The treatment solution is either mixed with a cleaning fluid, a rinsing fluid or a drying vapor, and is used in a cleaning apparatus employing a Marangoni dryer.

19 Claims, 2 Drawing Sheets

TREATMENT SOLUTION AND METHOD OF APPLYING A PASSIVATING LAYER

FIELD OF THE INVENTION

This invention relates to a treatment solution of the type, for example, used in a cleaning, rinsing and/or drying stage of processing a semiconductor wafer, such as after a Chemical Mechanical Processing stage. This invention also relates to a method of applying a passivating layer to a surface of a semiconductor wafer.

BACKGROUND OF THE INVENTION

In the field of semiconductor device fabrication, in order to protect copper surfaces from corrosion between a Chemical Mechanical Polishing (CMP) stage and subsequent processing steps, it is desirable to provide a passivating layer during the fabrication of semiconductor devices on a semiconductor wafer. In this respect, the passivating layer can be applied as a last step of the CMP stage and/or prior to subjecting the wafer to a post-CMP clean step. However, either a polishing platen or a so-called "brush station" is typically employed in these steps, the mechanical action of the polishing platen and/or brushes of the brush station erodes the newly-formed passivating layer of the wafer. The integrity of the passivating layer is therefore compromised, which can results in reduced corrosion protection and carbon containing defects on the surface of the wafer.

Consequently, WO2004/102620 discloses a method of disposing a passivating layer after the clean stage using a so-called "Spin Rinse Dry" (SRD) station. However, advanced dielectrics and passivated copper surfaces formed as part of a semiconductor wafer are sometimes hydrophobic in nature leading to the formation of watermarks on the wafer during drying of the wafer after the clean step. Consequently, the watermarks that form on wafers during drying of the wafers serve to impede the formation of a good quality passivating layer on the wafer thereafter.

STATEMENT OF INVENTION

According to the present invention, there is provided a treatment solution and a method of applying a passivating layer to a surface of a semiconductor wafer as set forth in the appended claims.

BRIEF DESCRIPTION OF THE DRAWINGS

At least one embodiment of the invention will now be described, by way of example only, with reference to the accompanying drawings, in which.

DESCRIPTION OF PREFERRED EMBODIMENTS

Figure 1:
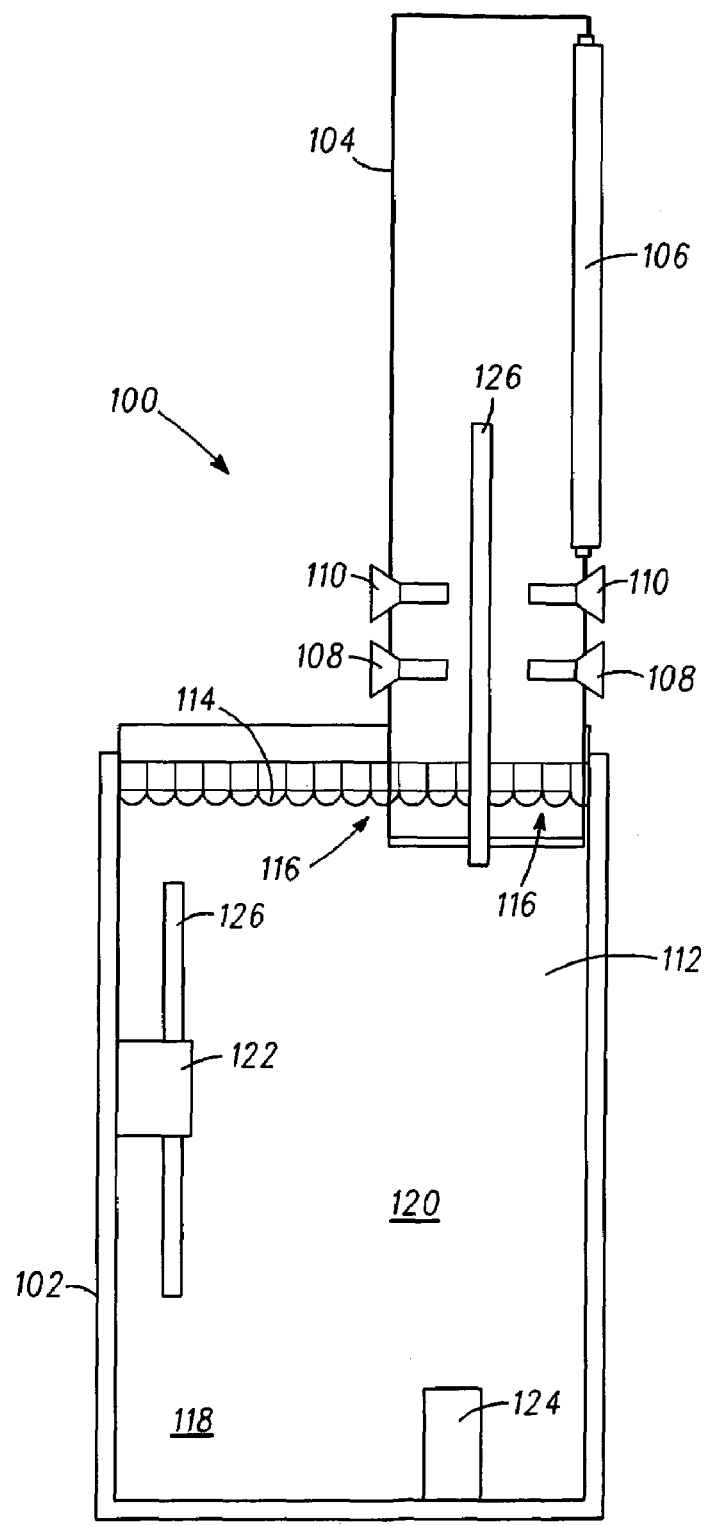
FIG. 1 is a schematic diagram of a cleaning apparatus that is used in conjunction with a treatment solution constituting an embodiment of the invention.

Throughout the following description identical reference numerals will be used to identify like parts.

Referring to FIG. 1, a cleaning, rinsing and drying apparatus 100 (hereinafter referred to as a "cleaning apparatus") is employed to clean semiconductor wafers after a Chemical Mechanical Polishing (CMP) stage of a semiconductor manufacturing process. In this example, the cleaning apparatus 100 is a Desica™ cleaning apparatus, supplied by Applied Materials, Inc., capable of so-called Marangoni drying of wafers; the structure and operation of the apparatus is known from, for example, U.S. Pat. No. 6,328,814.

However, to facilitate description of embodiments of the invention set forth herein, the skilled person should appreciate that the cleaning apparatus 100 comprises, inter alia, a bath 102 coupled to a drying chamber 104, the drying chamber 104 having a sealable port 106. A pair of arrays of rinsing nozzles 108 are disposed either side of the interior of the drying chamber 104 above the bath 102, and a pair of arrays of vapour dispensing nozzles 110 are disposed above the pair of rinsing nozzles 108, also inside the drying chamber 104.

The bath 102 is filled with a cleaning fluid 112, a level 114 of the cleaning fluid 112 residing above a lowermost part 116 of the drying chamber 104. The bath 102 comprises a cleaning region 118 and a rinsing region 120. Additionally, a so-called "substrate shuttle" 122 is disposed in cleaning region 118 and is capable of extending into the rinsing region 120. At the bottom of the bath 102 in the rinsing region 120, a wafer lifting mechanism 124 is disposed.

In this example, the cleaning fluid 112 is an acidic or alkaline post-CMP cleaning solution, for example ESC 784 available from ATMI, ElectraClean available from Applied Materials, Inc., or C-100 available from Waco. Alternatively, the cleaning fluid can simply be de-ionised water only, or diluted alcohols as will be described later herein. Indeed, the cleaning fluid can be any other suitable known cleaning fluid. In this respect, the cleaning fluid can comprise one or more additives, for example a pH adjusting fluid to regulate the pH of the cleaning fluid, for example ammonium alkyl species, such as tetramethyl ammonium hydroxide (TMAH) or tetraethyl ammonium hydroxide (TEAH). Additionally or alternatively, the cleaning fluid can comprise a complexing agent, for example, citric or oxalic acid or ammonium salts of the citric or oxalic acid. The cleaning solution can also be supplemented with one or more corrosion inhibitors, for example, 1,2,4 triazole, benzotriazole, or bipiridyne. Organic amines and/or acids, for example methyl amine, ethylamine, citric or oxalic acid can be used to serve as a complexing agent, a corrosion inhibitor and/or a pH adjuster.

A rinsing fluid (not shown) is, in this example, the same as the cleaning fluid 112. However, the rinsing fluid can be different to the cleaning fluid 112, for example, simply de-ionised water. However, use of the same fluid as the cleaning fluid 112 and the rinsing fluid avoids a need to provide a partition wall between the cleaning and rinsing regions 118, 120 of the bath 102.

In order to dry wafers, the vapour dispensing nozzles 110 usually dispense a drying vapour, such as Isopropylalcohol (IPA) vapour, that lowers a surface tension of the rinsing fluid upon condensation or absorption of the drying vapour by the rinsing fluid. However, in this example, the drying vapour is augmented by mixing the drying vapour with a treatment solution. The treatment solution comprises a passivating reagent, for example a corrosion inhibitor, such as 1,2,4 triazole, benzotriazole, or bipiridyne, and a surfactant, for example non-ionic block polymer surfactants, such as RPE 2520 or PE 1710 available from BASF. Other types of surface active agents including anionic or cationic surfactants can also be used.

Figure 2:
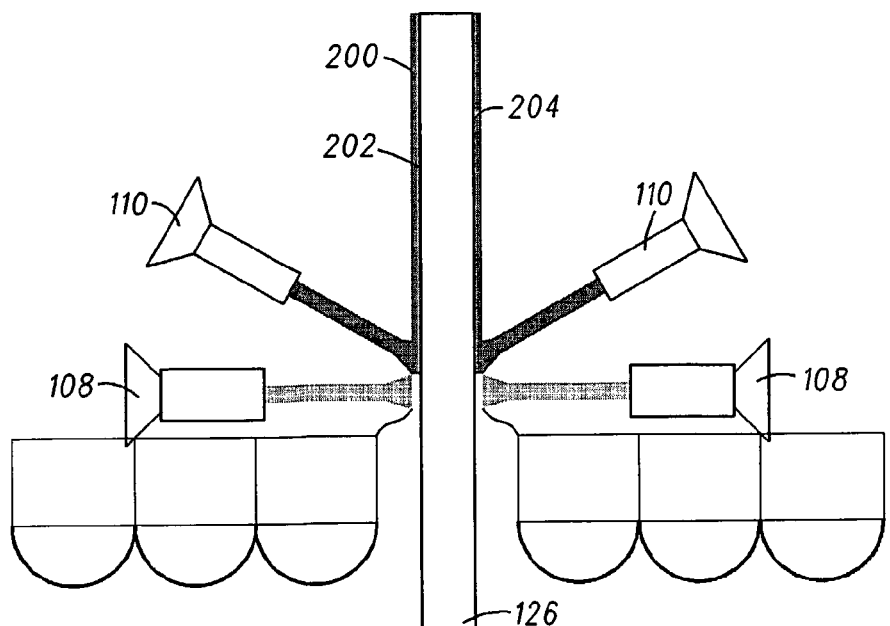
FIG. 2 is a schematic diagram of a wafer being treated in the apparatus of FIG. 1.
Figure 3:
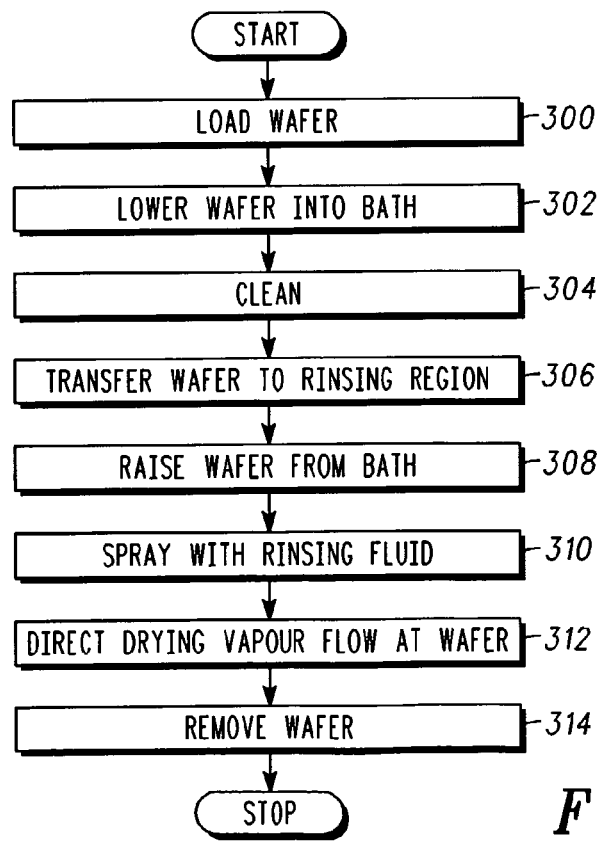
FIG. 3 is a flow diagram of a method of treating a surface of a wafer constituting another embodiment of the invention.

In operation (FIGS. 2 and 3), a semiconductor wafer 126 is loaded (Step 300) into the cleaning apparatus 100 and lowered (Step 302) into the substrate shuttle 122 and hence the cleaning fluid 112 by a robot (not shown), thereby exposing the wafer 126 to the cleaning fluid 112. The wafer 126 remains immersed in the cleaning region 118 of the bath 102, for example, for between about 20 s and 2 minutes, during which time the cleaning fluid 112 cleans (Step 304) the wafer 126 with the assistance of a so-called "megasonic" cleaning device (not shown). In this example, the cleaning of the wafer is brushless.

Thereafter, the substrate shuttle 122 extends laterally to move (Step 306) the wafer 126 from the cleaning region 118 to the rinsing region 120 of the bath 102. By contacting a lower edge of the wafer 126, the wafer lifting mechanism 124 then raises (Step 308) the wafer 126 into the drying chamber 104.

As the wafer 126 passes the pair of arrays of rinsing nozzles 108, the rinsing fluid is sprayed (Step 310) as a chord respectively across both sides of the wafer 126. Immediately after application of the rinsing fluid, the augmented drying vapour is applied (Step 312), in a similar linear manner, to the rinsing fluid by the pair of arrays of vapour dispensing nozzles 110. In this respect, the drying chamber 104 uses Marangoni drying principles to dry the surfaces of the substrate 126. The augmented IPA vapour directed, by the pair of arrays of vapour dispensing nozzles 110, onto the surfaces of the wafer 126 results in a passivating layer 200 being formed predominantly over the copper disposed on a front surface 202 of the wafer 126. However, the skilled person will appreciate that the passivating reagent can also be present on a backside surface 204 of the wafer 126 depending upon the chemistry of the backside surface 204 of the wafer 126. The presence of the surfactant serves to improve the wettability of the surfaces of the wafer 126 and the homogeneity with which the passivating reagent covers each surface of the wafer 126, thereby counteracting a reduction in the wettability of one or both surfaces of the wafer 126 caused by the passivating reagent and hence improving the efficiency of the passivating layer. Additionally, and consistent with the behaviour of the IPA in the augmented IPA vapour, the IPA is miscible with, and dissolves in, the rinsing fluid. The concentration gradient of the IPA dissolved in the rinsing fluid across the surface of the rinsing fluid thus results in different surface tension forces, and hence a surface tension differential, across the surface of the rinsing fluid from interfaces with each surface of the wafer 126 to the interfaces with the ambient of the drying chamber 104, i.e. perpendicular to the surfaces of the wafer 126. The surface tension differential causes any residual liquid on either surface of the wafer 126 to be run downwardly off the wafer 126 under the influence of gravity. The use of the IPA (a solvent) also serves to mitigate the formation of precipitates and enhances solubility of the passivating reagent in the rinsing fluid.

As the wafer 126 is gradually removed from the cleaning fluid, the coverage of the surfaces of the wafer 126 with the passivating layer 200 gradually increases until the wafer 126 is completely removed from the cleaning fluid 112 and has passed both the pair of arrays of rinsing nozzles 108 and the pair of arrays of vapour dispensing nozzles 110. The skilled person will therefore appreciate that the wafer 126 is dried in accordance with the Marangoni drying principle, but beneficially is also coated with the passivating layer 200 during the drying process to protect metals on the surface of the wafer 126, for example copper, such as copper interconnects of semiconductor devices.

Thereafter, the wafer 126 is removed (Step 314) from the drying chamber 104 via the sealable port 106 by another robot or the same robot as already mentioned above. The wafer 126 is then passed to another processing tool for undergoing another step in the semiconductor manufacturing process mentioned above.

In another embodiment, instead of augmenting the drying vapour with the treatment solution, the rinsing fluid is augmented with the treatment solution. The now augmented rinsing solution is applied to the surfaces of the wafer 126 in the same way as already described above in relation to the previous embodiment, i.e. via the pair of arrays of rinsing nozzles 108. However, instead of simply rinsing the cleaning fluid from the surfaces of the wafer 126, the presence of the passivating reagent in the augmented rinsing fluid serves to dispose the passivating layer 200 onto either or both surfaces of the wafer 126 by the absorption or adsorption of the passivating reagent to the metallic components on each surface. The surfactant in the augmented rinsing fluid provides the same function as already described above in relation to the previous embodiment. As in the previous example, the passivating layer 200 serves to protect metals on the surface of the wafer 126, for example copper, such as copper interconnects of semiconductor devices.

In a further embodiment of the invention, instead of augmenting the drying vapour or the rinsing fluid, the cleaning fluid 112 is augmented with the treatment solution. Consequently, whilst the wafer 126 is immersed in the cleaning fluid 112, not only are the surfaces of the wafer 126 cleaned, but also the passivating layer 200 is disposed upon the cleaned surfaces of the wafer 126. Again, the passivating layer 200 is formed on one or both surfaces of the wafer 126 by the absorption or adsorption of the passivating reagent to the metallic components on each surface. The surfaces of the wafer 126 are then rinsed by the rinsing fluid from the pair of rinsing nozzles 108 and then dried by the additional provision of the IPA from the pair of arrays of vapour dispensing nozzles 110. As in the previous example, the passivating layer 200 serves to protect metals on the surface of the wafer 126, for example copper, such as copper interconnects of semiconductor devices.

Whilst the above embodiments have been described in the context of the use of the drying chamber 104 having the pairs of arrays of rinsing and vapour dispensing nozzles 108, 100, it should be appreciated that the cleaning fluid can be augmented with IPA or another suitable substance as well as the treatment solution. In such an embodiment, the wafer 126 is slowly removed from the bath 102, the residual cleaning fluid 112 running off the surfaces of the wafer 126 by virtue of the presence of the IPA. As in the case of the previous embodiment, not only are the surfaces of the wafer 126 cleaned, but also the passivating layer 200 is disposed upon the cleaned surfaces of the wafer 126.

Although the above embodiments have been described in relation to the surfaces of a wafer, the wafer comprising one or more layers, the skilled person will appreciate that the above described techniques and solutions can be applied to other surfaces, be they of a semiconductor wafer, a substrate or other carrier or layer disposed upon a carrier and upon which a passivating layer needs to be formed.

It is thus possible to provide a method of applying a passivating layer to a surface of a semiconductor wafer and a treatment solution therefor that protects copper interconnects from corrosion and reduces the likelihood of formation of defects in the copper interconnects, even in the presence of advanced dielectric stacks. Consequently, manufacturing yields can be improved with only a relatively minor modification to existing vapour drying equipment.

The invention claimed is:

1. A method of applying a passivating layer to a surface as part of a cleaning process comprising Marangoni drying, the method comprising the steps of:
   mixing a treatment solution with an organic solvent for drying the surface of the semiconductor wafer, the treatment solution comprising:
   water;
   a surface passivating reagent for inhibiting metal corrosion; and
   a surfactant to provide homogeneity of coverage of the surface by the surface passivating reagent; and
   drying the surface of the semiconductor wafer by applying the mixture of the treatment solution and the organic solvent to the surface of the semiconductor wafer, thereby causing the passivating layer to form on the semiconductor wafer.

2. A method as claimed in claim 1, wherein the organic solvent and treatment solution mixture are applied by spraying the organic solvent and treatment solution mixture onto the surface of the semiconductor wafer.

3. A method as claimed in claim 1, wherein the passivating reagent is a corrosion inhibitor.

4. A method as claimed in claim 3, wherein the corrosion inhibitor is an organic amine and/or acid.

5. A method as claimed in claim 4, wherein the organic amine and/or acid are/is one or more of: methyl amine, ethylamine, citric and/or oxalic acid.

6. A method as claimed in claim 3, wherein the corrosion inhibitor is any one of 1,2,4 triazole, benzotriazole, or bipyridine.

7. A method as claimed in claim 1, wherein the treatment solution further comprises:
   a complexing agent.

8. A method as claimed in claim 7, wherein the complexing agent is an organic amine and/or acid.

9. A method as claimed in claim 8, wherein the organic amine and/or acid are one or more of: methyl amine, ethylamine, citric and/or oxalic acid.

10. A method as claimed in claim 7, wherein the complexing agent is an ammonium salt of citric and/or oxalic acid.

11. A method as claimed in claim 1, wherein the treatment solution further comprises:
    a pH adjuster.

12. A method as claimed in claim 11, wherein the pH adjuster is an organic amine and/or acid.

13. A method as claimed in claim 12, wherein the organic amine and/or acid are one or more of: methyl amine, ethylamine, citric and/or oxalic acid.

14. A method as claimed in claim 11, wherein the pH adjuster is an ammonium alkyl species.

15. A method as claimed in claim 14, wherein the ammonium alkyl species is one of: tetramethyl ammonium hydroxide (TMAH) or tetraethyl ammonium hydroxide (TEAH).

16. A method as claimed in claim 1, wherein the treatment solution further comprises:
    an organic solvent for drying the surface of the wafer.

17. A method as claimed in claim 1, wherein the surfactant comprises a non-ionic surfactant.

18. A method as claimed in claim 1, wherein the surfactant comprises an ionic surfactant.

19. A method as claimed in claim 18, wherein the ionic surfactant is a cationic surfactant and/or an anionic surfactant.

* * * * *